United States Patent
Schwarz et al.

(10) Patent No.: US 9,911,719 B2
(45) Date of Patent: Mar. 6, 2018

(54) SEMICONDUCTOR COMPONENT, LIGHTING DEVICE AND METHOD FOR PRODUCING A SEMICONDUCTOR COMPONENT

(71) Applicant: OSRAM Opto Semiconductors GmbH, Regensburg (DE)

(72) Inventors: Thomas Schwarz, Regensburg (DE); Frank Singer, Regenstauf (DE); Juergen Moosburger, Lappersdorf (DE); Georg Bogner, Lappersdorf (DE); Herbert Brunner, Sinzing (DE); Matthias Sabathil, Regensburg (DE); Norwin Von Malm, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/310,428

(22) PCT Filed: Mar. 31, 2015

(86) PCT No.: PCT/EP2015/057096
§ 371 (c)(1),
(2) Date: Nov. 10, 2016

(87) PCT Pub. No.: WO2015/172937
PCT Pub. Date: Nov. 19, 2015

(65) Prior Publication Data
US 2017/0077070 A1    Mar. 16, 2017

(30) Foreign Application Priority Data
May 14, 2014    (DE) .......... 10 2014 106 791

(51) Int. Cl.
*H01L 25/075*    (2006.01)
*H01L 33/54*    (2010.01)
(Continued)

(52) U.S. Cl.
CPC .......... *H01L 25/0753* (2013.01); *H01L 33/54* (2013.01); *H01L 33/62* (2013.01);
(Continued)

(58) Field of Classification Search
CPC ...... H01L 25/0753; H01L 33/54; H01L 33/62
See application file for complete search history.

(56) References Cited

U.S. PATENT DOCUMENTS

2008/0272383 A1    11/2008    Loh
2009/0173954 A1    7/2009    Beeson et al.
(Continued)

FOREIGN PATENT DOCUMENTS

DE    102009036621 A1    2/2011
DE    102010024864 A1    12/2011
(Continued)

OTHER PUBLICATIONS

"Cuw Yash", Datasheet, Draft Version, 2013, 23 pgs.

*Primary Examiner* — Daniel Shook
(74) *Attorney, Agent, or Firm* — McDermott Will & Emery LLP

(57) ABSTRACT

The invention relates to a semiconductor component (1) comprising: a plurality of semiconductor chips (2), each having a semiconductor layer sequence (200) with an active region (20) for generating radiation; a radiation output side (10) that runs parallel to the active regions (20); a mounting side surface (11) which is provided for securing the semiconductor component, and which runs in a transverse or perpendicular direction to the radiation output side; a molded body (4) which is shaped in places on the semiconductor chips, and which at least partially forms the mounting side surface; and a contact structure (50) which is arranged on the molded body, and which connects at least two semiconductor chips of the plurality of semiconductor chips (Continued)

Figure 1A:
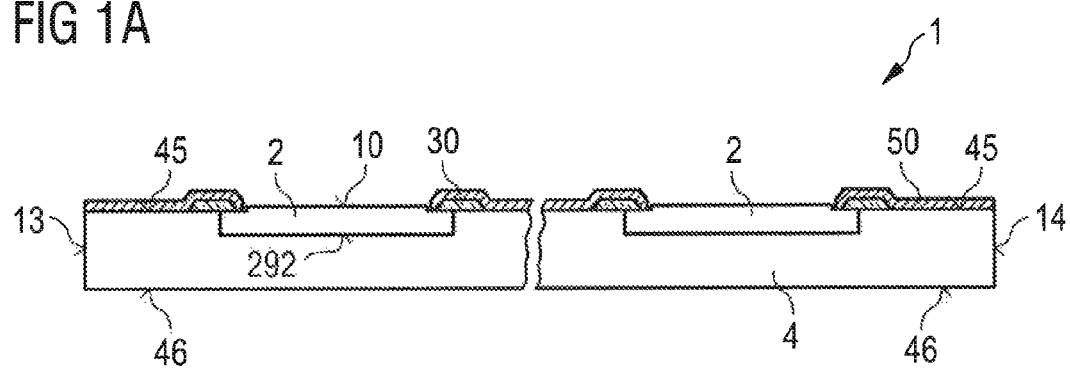

in an electrically conductive manner. The invention also relates to a lighting device (9) and to a method for producing a semiconductor component.

18 Claims, 11 Drawing Sheets

(51) Int. Cl.
*H01L 33/62* (2010.01)
*H01L 33/00* (2010.01)

(52) U.S. Cl.
CPC ...... *H01L 33/0095* (2013.01); *H01L 2224/18* (2013.01); *H01L 2924/0002* (2013.01); *H01L 2933/0033* (2013.01); *H01L 2933/0066* (2013.01)

(56) References Cited

U.S. PATENT DOCUMENTS

| | | |
|---|---|---|
| 2009/0230420 A1 | 9/2009 | Bogner et al. |
| 2010/0171135 A1* | 7/2010 | Engl ............... H01L 33/382 257/98 |
| 2010/0283062 A1 | 11/2010 | Hsieh et al. |
| 2011/0170303 A1 | 7/2011 | Wu et al. |
| 2011/0242805 A1 | 10/2011 | Jin et al. |
| 2012/0049237 A1 | 3/2012 | Hata et al. |
| 2015/0014737 A1* | 1/2015 | Illek ............... H01L 33/62 257/99 |

FOREIGN PATENT DOCUMENTS

| | | |
|---|---|---|
| DE | 102011011139 A1 | 8/2012 |
| DE | 102012002605 A1 | 8/2013 |
| DE | 102013103226 A1 | 10/2014 |
| JP | H06127026 A | 5/1994 |

* cited by examiner

SEMICONDUCTOR COMPONENT, LIGHTING DEVICE AND METHOD FOR PRODUCING A SEMICONDUCTOR COMPONENT

The present application relates to a semiconductor component, to a lighting device having a semiconductor component and to a method for producing an optoelectronic semiconductor component.

Backlit liquid crystal displays are often times used in handheld electronic devices such as cell phones. A reduction of the construction height of such devices results in requirements in terms of construction height of the light sources that cannot be achieved by means of conventional LED configurations readily.

One object is to provide an optoelectronic semiconductor component which is characterized by a low construction height and at the same time provides a luminous flux sufficient for use of the device. Furthermore, the intention is to provide a lighting device and a method that allows producing such a semiconductor component in a simple and cost-efficient manner.

Inter alia, said objects are achieved by a semiconductor component and a method according to the independent claims, respectively. Further configurations and developments are the subject-matter of the dependent claims.

According to at least one embodiment, an optoelectronic semiconductor component comprises at least one semiconductor chip for generating radiation, in particular a plurality of such semiconductor chips. At least one of said chips comprises a semiconductor layer sequence having an active region provided for the generation of radiation. In particular, the active region is provided for the generation of radiation in the visible, ultraviolet or infrared spectral range. For example, the semiconductor layer sequence comprises a first semiconductor layer of a first conductive type and a second semiconductor layer of a second conductive type different from the first conductive type. The active region is arranged between the first semiconductor layer and the second semiconductor layer. Appropriately, the semiconductor chip comprises a first contact and a second contact for electrical contacting of the semiconductor chip. In particular, the first contact is provided for electrically contacting the first semiconductor layer and the second contact is provided for electrically contacting the second semiconductor layer. Said contacts may each be designed as a partial region of the first semiconductor layer or the second semiconductor layer, or as additional layers, e.g. metal layers, connected to said layers in an electrically conductive manner. For example, the semiconductor chip comprises a carrier with the semiconductor layer sequence arranged thereon. Said carrier may be the growth substrate for the particularly epitaxial deposition of the semiconductor layer sequence. As an alternative, the carrier may be different from a growth substrate. In this case, the carrier serves for mechanically stabilizing the semiconductor layer sequence so that the growth substrate is no longer required and may be entirely or at least sectionally removed or thinned.

According to at least one embodiment of the optoelectronic semiconductor component, a radiation output side of the semiconductor component runs parallel to the active regions, i.e. parallel to a main extension plane of said active regions. In particular, the optoelectronic semiconductor component comprises exactly one radiation output side.

According to at least one embodiment of the optoelectronic semiconductor component, the semiconductor component comprises a mounting side surface which is provided for fastening the semiconductor component and runs inclined or perpendicular to the radiation output side. In particular, the mounting side surface runs perpendicular or essentially perpendicular to the radiation output side. The term "essentially perpendicular" relates to a deviation of 10° from the vertical orientation at the most.

According to at least one embodiment of the semiconductor component, the semiconductor component comprises a molded body which is formed to the semiconductor chips in places. At the places where the molded body is formed to the semiconductor chip, the molded body is particularly directly adjacent to the semiconductor chip. For example, the molded body is designed in one piece. Furthermore, the molded body is designed to be electrically insulating. In particular, the molded body at least sectionally forms the mounting side surface. In particular, the molded body forms at least sectionally a side surface of the semiconductor component. The molded body may also form two or more, e.g. all side surfaces of the semiconductor component. In case of doubt, the term "side surface" relates to the outer faces of the semiconductor chip that run inclined or perpendicular to the radiation output side. In other words, the side surfaces and in particular the mounting side surface extend between a rear side of the molded body facing away from the radiation output side and a front side of the molded body opposite the rear side.

Appropriately, the semiconductor chips are entirely or at least sectionally free from the molded body at the radiation output side of the semiconductor component. Thus, in a plan view of the radiation output side, the semiconductor chips are not covered by the molded body or merely in places covered by the molded body. In particular, the molded body is designed to be opaque for the radiation generated in the active region. For example, the molded body is designed to be reflecting for the generated radiation, e.g. with a reflectivity of at least 60%, e.g. at least 80%. However, the molded body may just as well have a transparent or at least translucent design for the radiation.

According to at least one embodiment of the semiconductor component, the semiconductor component comprises at contact structure. The contact structure is in particular arranged on the molded body, e.g. on the front side of the molded body. The contact structure connects at least two of the semiconductor chips in an electrically conductive manner. For example, the contact structure comprises a first contact surface and a second contact surface for the external electrical contacting of at least one of the semiconductor chips. The semiconductor chips may at least partially be electrically connected in series or parallel or in a combination of series connection and parallel connection.

In at least one embodiment of the semiconductor component, said semiconductor component comprises a plurality of semiconductor chips each having a semiconductor layer sequence having an active region provided for the generation of radiation. A radiation output side of the semiconductor component runs parallel to the active regions. A mounting side surface of the semiconductor component provided for fastening the semiconductor component runs inclined or perpendicular to the radiation output side.

The semiconductor component comprises a molded body which is formed to the semiconductor chips in places and which at least sectionally forms the mounting side surface. Furthermore, the semiconductor component comprises a contact structure which is arranged on the molded body and which connects at least two semiconductor chips of the plurality of semiconductor chips in an electrically conductive manner.

According to at least one embodiment of the semiconductor component, all of the semiconductor chips of the semiconductor component provided for the generation of radiation are arranged next to one another along a longitudinal direction parallel to the radiation output side. Thus, the arrangement of the semiconductor component is of a row-type. As a result, there is no place in a transverse direction running perpendicularly to a longitudinal direction and parallel to the active regions at which two semiconductor chips are arranged next to one another. Preferably, a maximum extension of the semiconductor component in the longitudinal direction is at least five times the size of the maximum extension on the transverse direction. In the transverse direction, the maximum extension is preferably greater than the maximum extension of the semiconductor chips along said direction by 50% at most. The component height is thus only slightly greater than the height of the semiconductor chip decisive for the radiation output.

According to at least one embodiment of the semiconductor component, the molded body at least sectionally covers a rear side of the semiconductor chips that faces away from the radiation output side. In particular, the molded body may in each case entirely cover the rear sides of the semiconductor chips.

According to at least one embodiment of the semiconductor component, the semiconductor chips have two contacts each, said contacts facing the radiation output side and being connected to the contact structure in an electrically conductive manner. In other words, the semiconductor chips have two front-sided contacts, where front side relates to the side that faces the radiation output side.

According to at least one embodiment of the semiconductor component, the first contact surface and the second contact surface of the contact structure are accessible at the radiation output side and/or at the mounting side surface.

According to at least one embodiment of the semiconductor component, the semiconductor component comprises at least one electronic component which is electrically conductively connected to the contact structure and is externally electrically contactable via the first contact surface and the second contact surface. For example, the electric component is a constant current source, a protective element against electrostatic discharge (ESD) or a sensor, e.g. an optical sensor. For example, the molded body is formed to the electronic component at least in places. As an alternative, the electronic component may be arranged on the molded body.

In a plan view of the radiation output side, the semiconductor component extends in the longitudinal direction between a first end face and a second end face.

According to at least one embodiment of the semiconductor component, the first contact surface is arranged in a first end region adjacent to the first end face and the second contact surface is arranged in a second end region of the semiconductor component adjacent to the second end face. Thus, electrical contacting is effected at the opposite ends of the semiconductor component. The term "end region" relates to a region of the component located between the end face and the semiconductor chip provided for the generation of radiation and located closest to said end face. For example, all semiconductor chips of the semiconductor component provided for the generation of radiation are electrically connected in series and are externally electrically connectable by applying an electric voltage between the first contact surface and the second contact surface.

According to at least one embodiment of the semiconductor component, the first contact surface and the second contact surface are arranged in the first end region of the semiconductor component adjacent to the first end face. As a result, the semiconductor component is contactable from one side. For example, the contact structure comprises at least one contact track which runs in the longitudinal direction and which runs laterally past at least one semiconductor chip, e.g. all semiconductor chips of the semiconductor component provided for the generation of radiation, viewed in a plan view of the radiation output side.

According to at least one embodiment of the semiconductor component, the semiconductor component comprises at least one electrically conductive volume contact body, to which the molded body is formed and which is electrically conductively connected to the semiconductor chips. For example, the volume contact body extends at least partially, in particular entirely through the molded body in a vertical direction running perpendicularly to the radiation output side. The volume contact body is provided particularly for external electric contacting of the semiconductor component from a side surface of the semiconductor component.

According to at least one embodiment of the semiconductor component, in a plan view of the radiation output side, the semiconductor component has a rectangular basic shape with at least one indentation, wherein the contact structure covers a side surface of the indentation at least sectionally. It is also possible for the semiconductor component to have multiple of such indentations. For example, one indentation is formed on the first end face and/or on the second end face. As an alternative or in addition, at least one of the indentations may be arranged between two neighboring semiconductor chips.

The at least one indentation is accessible particularly from the mounting side surface. For example, the indentation essentially has the shape of a part of a circle. Such indentations can be manufactured in a simple manner. However, another basic shape may be used for the indentation. For example, the at least one indentation is formed on the edge or in a corner of the rectangular basic shape. The regions of the rectangular basic shape running linearly in a plan view are particularly free from material of the contact structure.

According to at least one embodiment of the semiconductor component, the semiconductor chips of the semiconductor component provided for the generation of radiation are divided in at least two groups, wherein said groups can be externally electrically contacted independently from one another by means of the contact structure arranged in the indentations.

According to at least one embodiment of the semiconductor component, the semiconductor component comprises a plurality of segments, with severing spots arranged between said segments, so that the segments are electrically conductively connected to one another before being severed at the severing spots and are externally electrically contactable and mountable independently from one another after being severed. The semiconductor component may be divided into individual segments that are mountable independently from one another. In particular, the individual segments each have at least one first and one second contact surface for the external electric contacting. For example, as a result, the length of the semiconductor component is adaptable to the application specific requirements.

According to at least one embodiment of the semiconductor component, the semiconductor component comprises an insulation layer, which particularly sectionally extends between the molded body and the contact structure. For example, in a plan view of the radiation output side, the insulation layer sectionally covers the molded body and sectionally at least one of the semiconductor chips provided for the generation of radiation. In other words, the insulation layer sectionally extends on an edge of the semiconductor chip, in a plan view of the radiation output side.

According to at least one embodiment, a lighting device comprises at least one semiconductor component and a light guide, wherein the semiconductor component comprises at least one of the above described features. During operation, radiation passing through the radiation output side of the semiconductor component couples into a side surface of the light guide. For example, the lighting device is provided for back-lighting a display device such as a liquid crystal display (LCD) device. For example, the lighting device is arranged in a particularly mobile electronic device such as a cell phone or a mobile computer.

The lighting device may also comprise more than one such semiconductor component. For example, at least two semiconductor components are arranged along the side surface of the light guide next to one another. Compared to a series connection of all semiconductor chips of the lighting device provided for the generation of radiation, the operating voltage to be applied to the individual semiconductor component—and thus the overall operating voltage to be applied in a parallel connection—can be reduced by the factor 1/n by means of a division into n semiconductor components—with an overall equal number of semiconductor chips provided for the lighting device.

According to at least one embodiment, a method for producing a semiconductor component comprises a step in which a plurality of semiconductor chips is provided, the chips each having a semiconductor layer sequence comprising an active region for generating radiation.

According to at least one embodiment of the method, said method comprises a step in which the semiconductor chips are sectionally overmolded by means of a molding material for the generation of a molded body composite. For example, said overmolding may be effected by means of a molding method, wherein the term molding method generally relates to a method for applying a molding material and particularly to injection molding, transfer molding, compression molding and casting.

Prior to the overmolding, the semiconductor chips may be provided at least sectionally with a reflective layer at the side surfaces and/or at a rear side of the semiconductor chip opposite a radiation output side of the semiconductor chip.

According to at least one embodiment of the method, the method comprises a step in which a particularly electrically conductive coating is formed on the molded body composite for electrical contacting of the semiconductor chip. Said coating is structured for the contacting, i.e. not designed to cover the entire area. For example, the coating may be formed by means of vapor deposition or sputtering. In a later step, the thickness of the electrically conductive coating may be increased particularly for increasing the electric conductivity, for example by means of galvanic or currentless deposition.

According to at least one embodiment of the method, said method comprises a step in which the molded body composite is singulized into a plurality of semiconductor components, wherein in each case at least two of the semiconductor chips of a semiconductor component are electrically conductively connected to one another by means of the contact structure made of structured coating and a side surface of the singulized molded body arising during singulation forms a mounting side surface of the semiconductor component.

Singulation particularly is effected not before applying the coating so that the side surfaces of the semiconductor components arising during singulation are free from material for the coating. For example, singulation may be effected by a mechanical method, for example sawing, or my means of coherent radiation, e.g. by means of laser cutting.

In at least one embodiment of the method for producing a semiconductor component, a plurality of semiconductor chips is provided, each comprising a semiconductor layer sequence having an active region provided for generating radiation. The semiconductor chips are sectionally overmolded with a molding material for the formation of a molded body composite. Said molded body composite is singulized into a plurality of semiconductor components each having a plurality of semiconductor chips, wherein in each case at least two of the semiconductor chips of a semiconductor component are electrically conductively connected to one another by means of the contact structure made of the structured coating and a side surface of the singulized molded body arising during singulation forms a mounting side surface of the semiconductor component.

According to at least one embodiment of the method, the molded body composite comprises a recess at least between two neighboring semiconductor chips prior to the formation of the coating, said recess being provided with said coating. The recesses may entirely or only partially extend through the molded body composite. The molded body composite may be designed such that the molded body composite readily comprises the recesses. As an alternative, said recesses may be introduced into the molded body composite my means of material removal after forming the molded body composite and before applying the coating, for example in a mechanical fashion such as drilling or by means of coherent radiation.

In particular, singulation of the molded body composite is effected through the recesses. For example, singulizing is effected such that the singulized semiconductor components have a rectangular basic shape with at least one indentation. In particular, the semiconductor components may have an indentation on a corner and/or at the mounting side surface.

According to at least one embodiment of the method, electrically conductively volume contact bodies are provided prior to the formation of the molded body composite, to which the molded body composite is formed and which are electrically conductively connected with at least one of the semiconductor chips via the structured coating.

The method described is particularly suitable for producing a semiconductor component described above. Thus, features described in conjunction with the semiconductor component can also be considered for the method and vice versa.

In the method described herein, the mounting side surface and also the side surface of the semiconductor component opposite the mounting side surface arise during the singulation step. The component height, i.e. the extension vertically to the mounting side surface, is thus determined by the distance of parallel separation lines during the singulation step and may thus take particularly low values. In particular, component height may be equal to or less than 500 µm. Preferably, component height is between including 100 µm and including 400 µm. Thereby, an especially compact semiconductor component can be produced that provides a sufficient luminous flux during operation. The emittable overall luminous flux is further adjustable by the number of the plurality of semiconductor chips of a component.

Forming the molded bodies may be effected in a large-area manner for a plurality of components in one common step of singulation. Here, in particular the individual molded bodies do not arise before the semiconductor chips are arranged within the molded body to be produced. As a result, there is no need for placing the semiconductor chips in pre-fabricated housings and electrically contacting them. The molded body that forms the housing is rather formed not before singulation of the molded body composite having the semiconductor chips embedded therein. The side surfaces, particularly the mounting side surfaces as well, arise when singulizing the molded body composite during production of the semiconductor component. Said side surfaces, in particular the mounting side surface, may thus bear traces of singulation, e.g. sawing traces or traces of a laser separation method.

Further embodiments and developments result from the following description of the exemplary embodiment with reference to the figures.

Figure 1B:
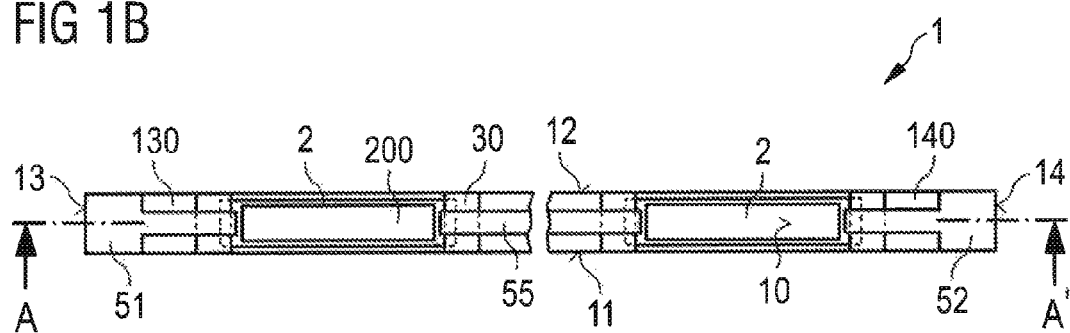
Figure 1C:
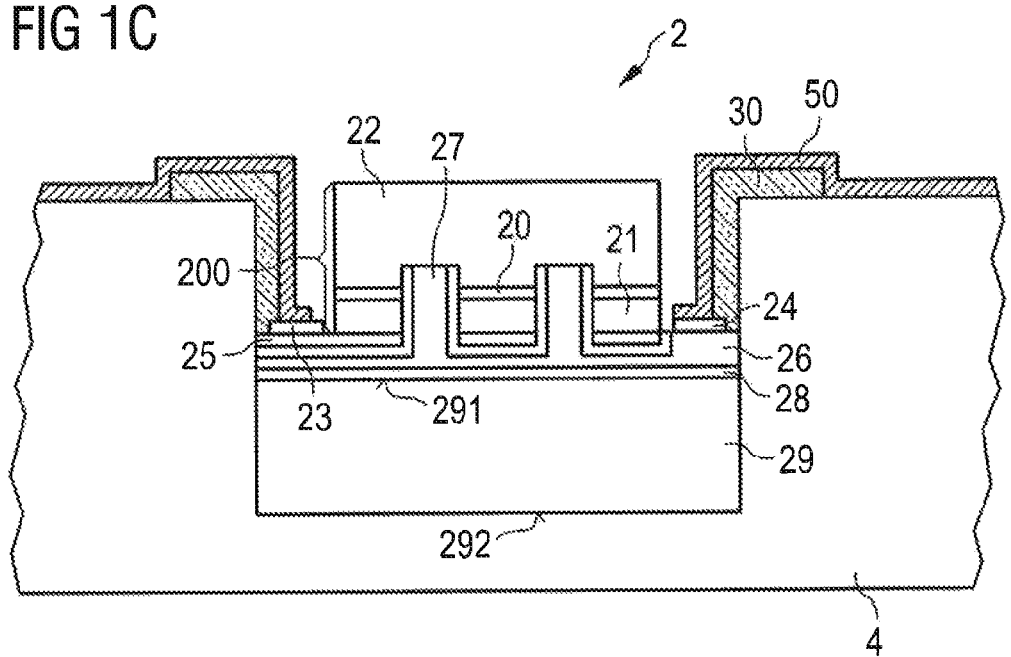
Figure 1D:
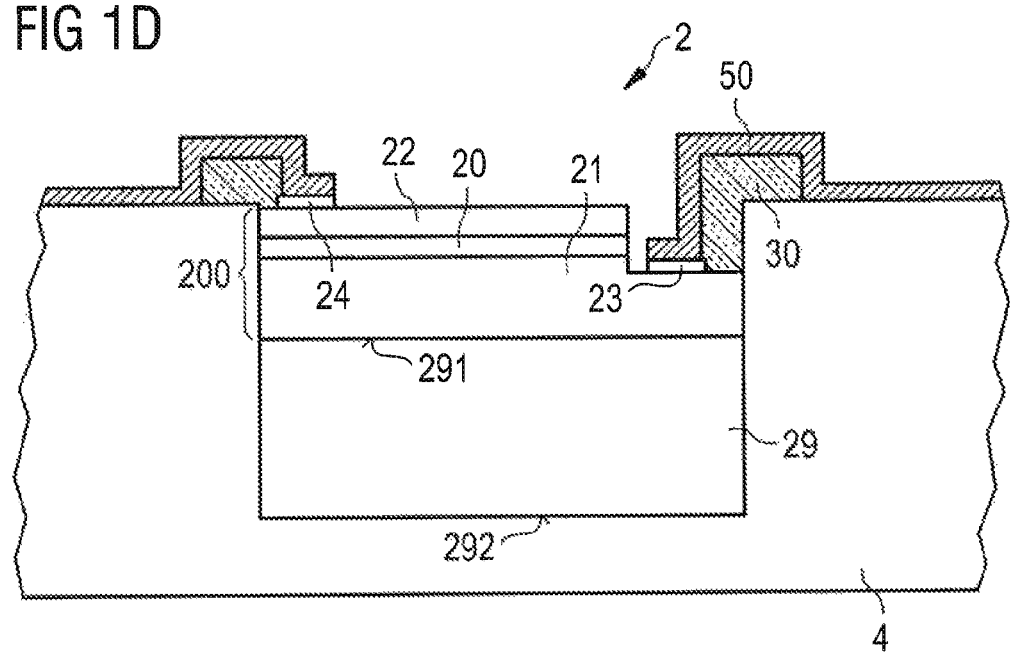
Figure 2:
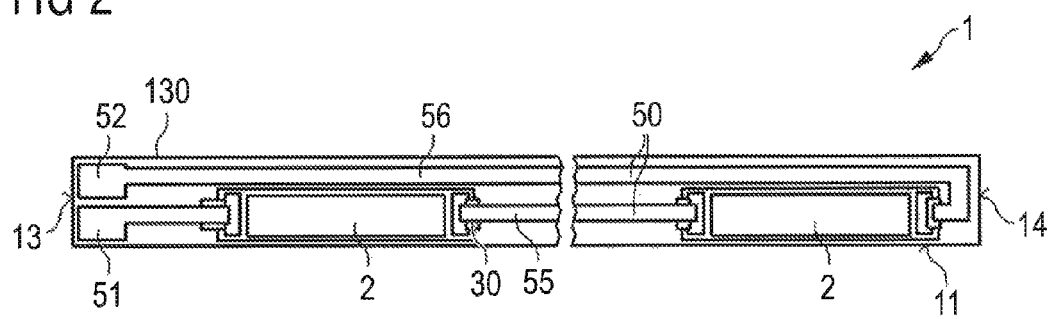
Figure 3:
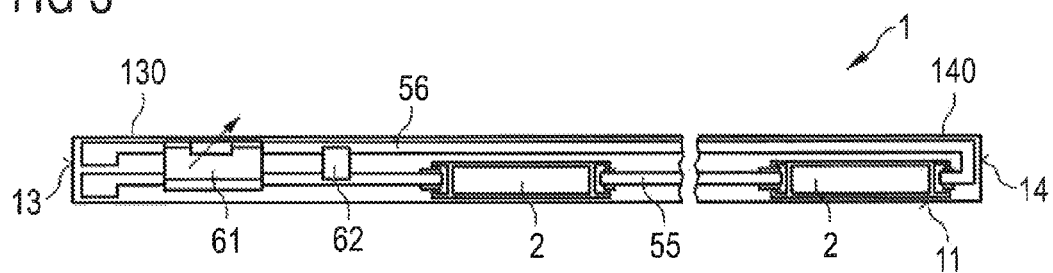
Figure 4:
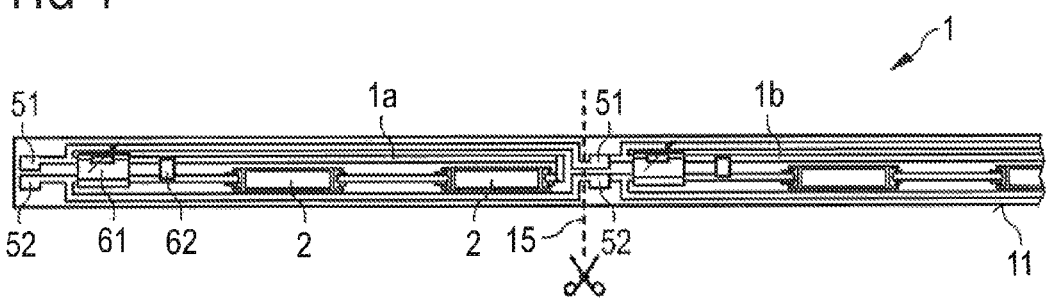
Figure 5A:
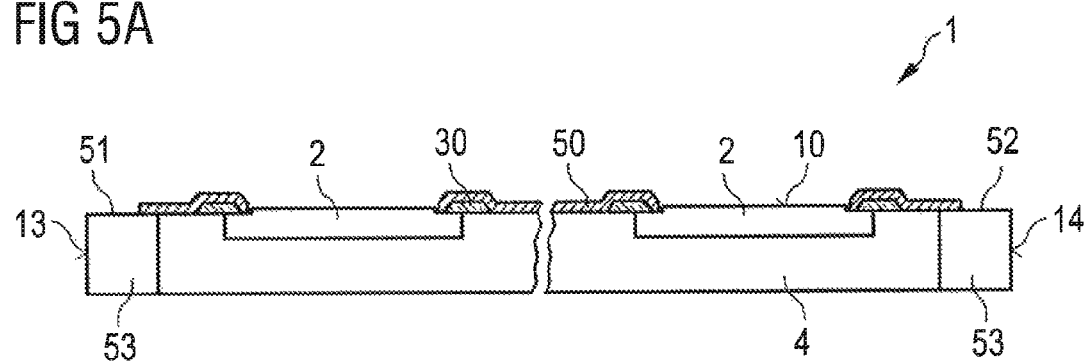
Figure 5B:
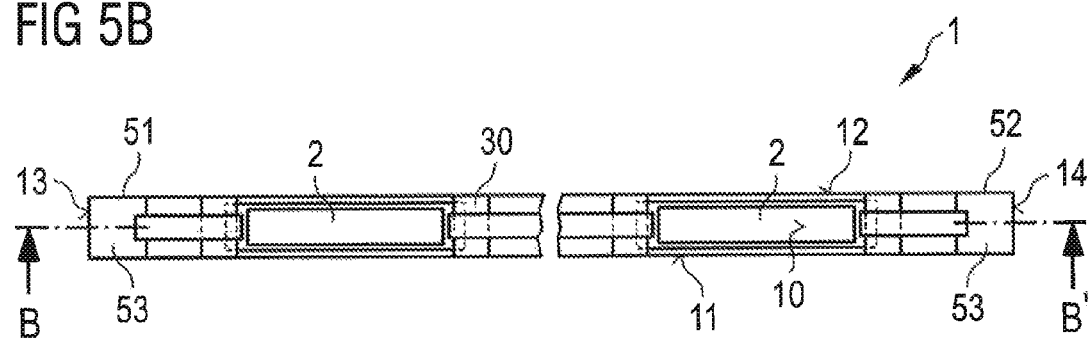
Figure 6A:
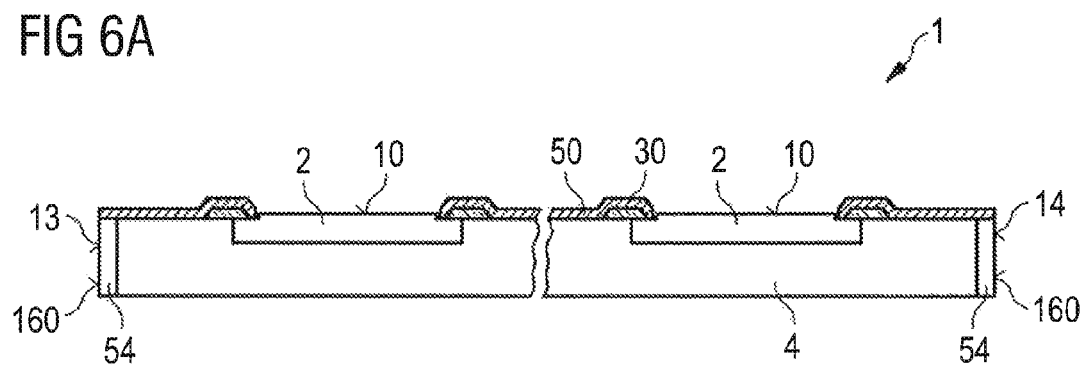
Figure 6B:
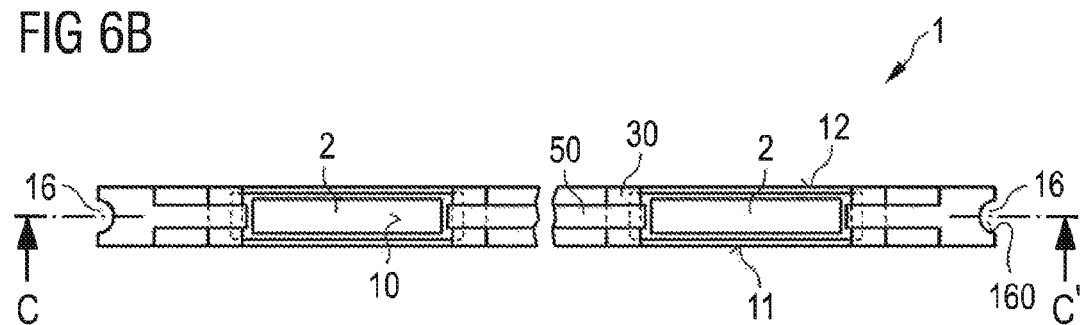
Figure 7A:
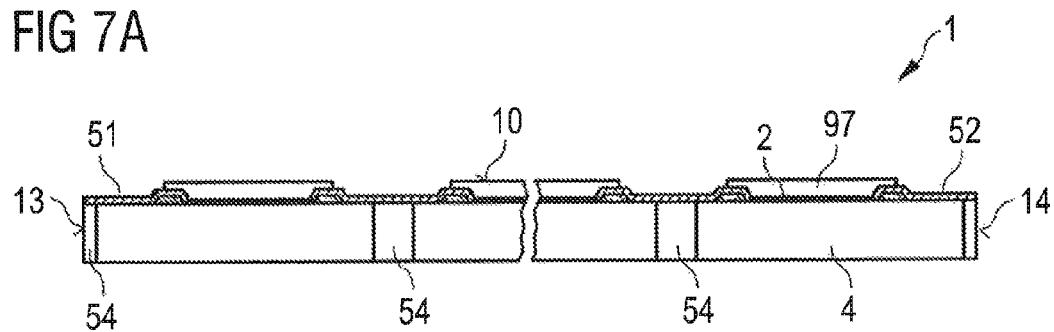
Figure 7B:
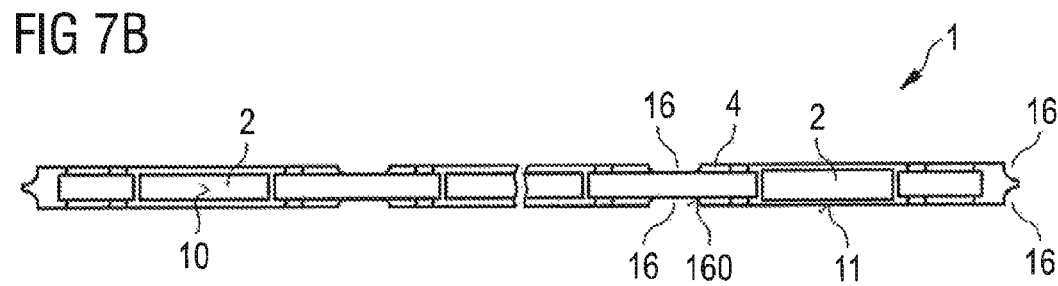
Figure 7C:
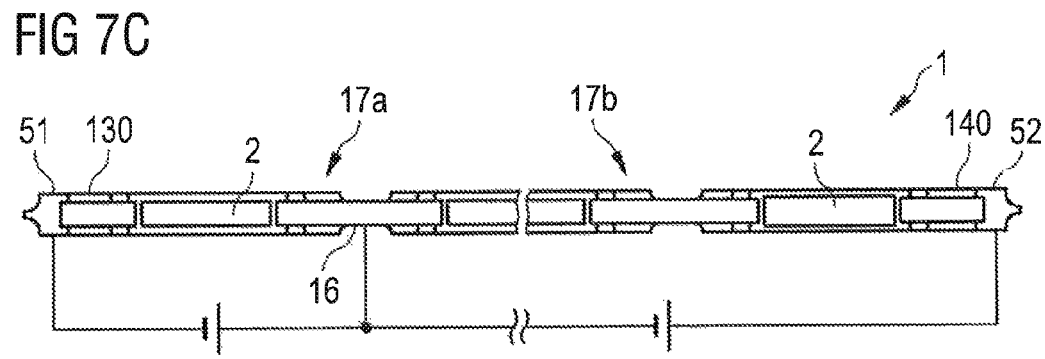
Figure 8A:
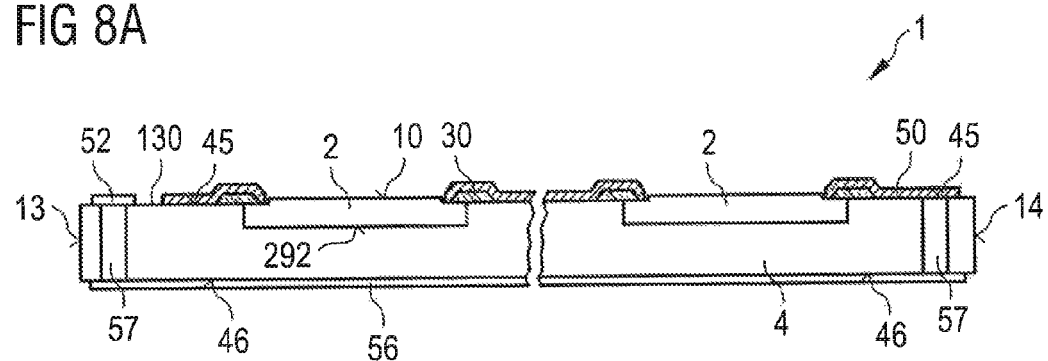
Figure 8B:
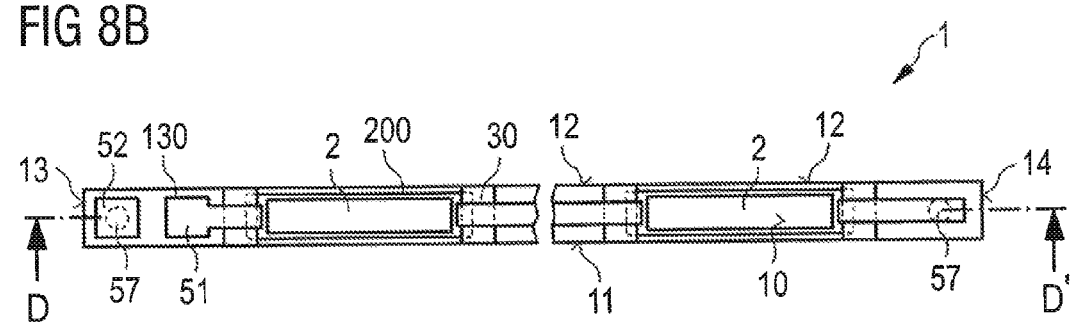
Figure 9A:
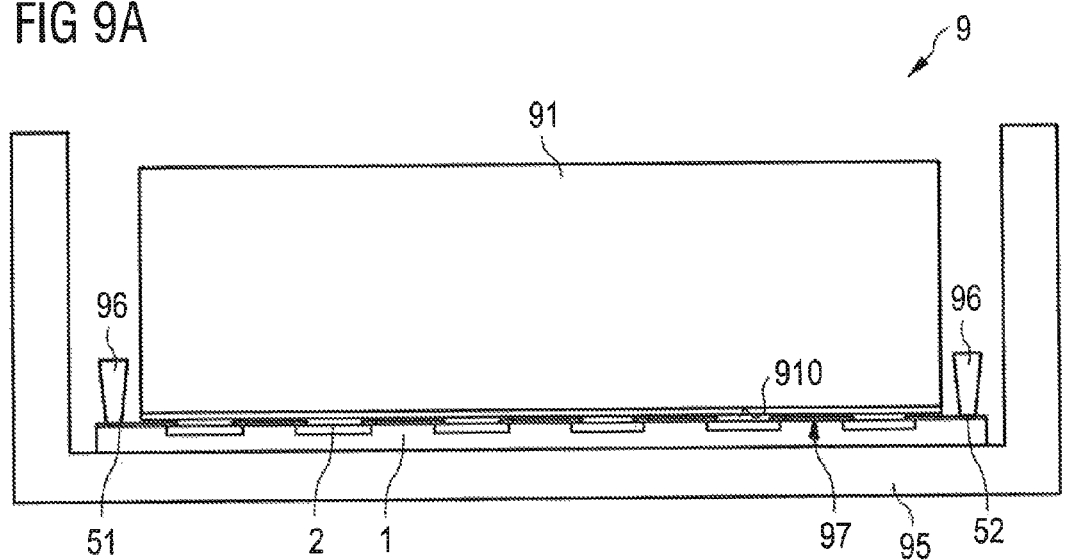
Figure 9B:
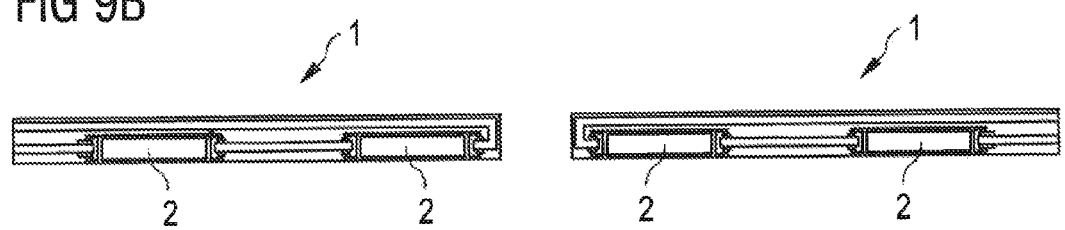
Figure 10A:
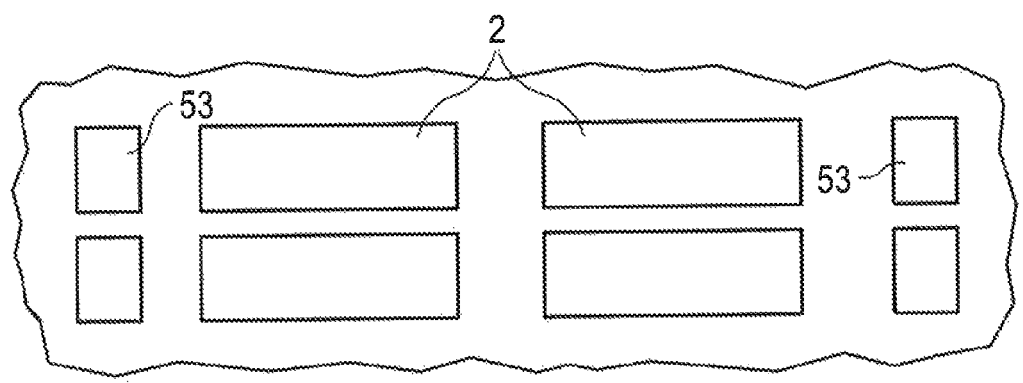
Figure 10B:
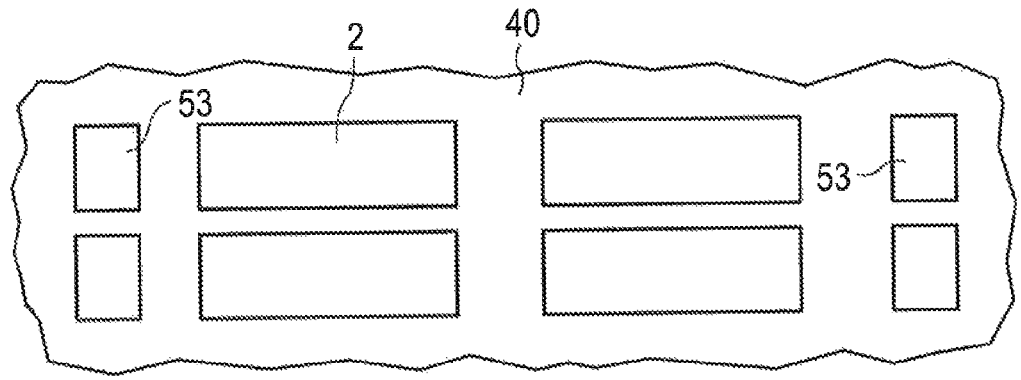
Figure 10C:
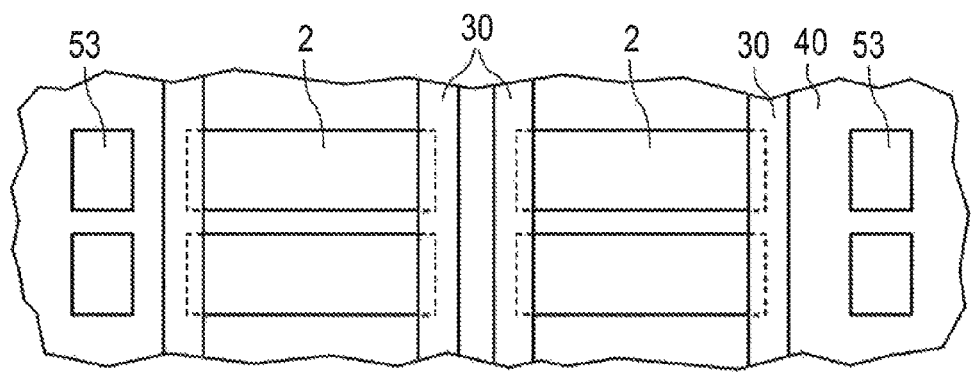
Figure 10D:
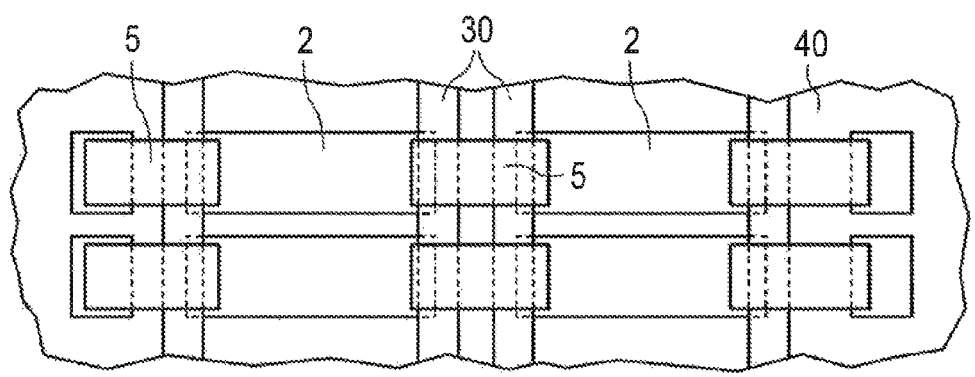
Figure 10E:
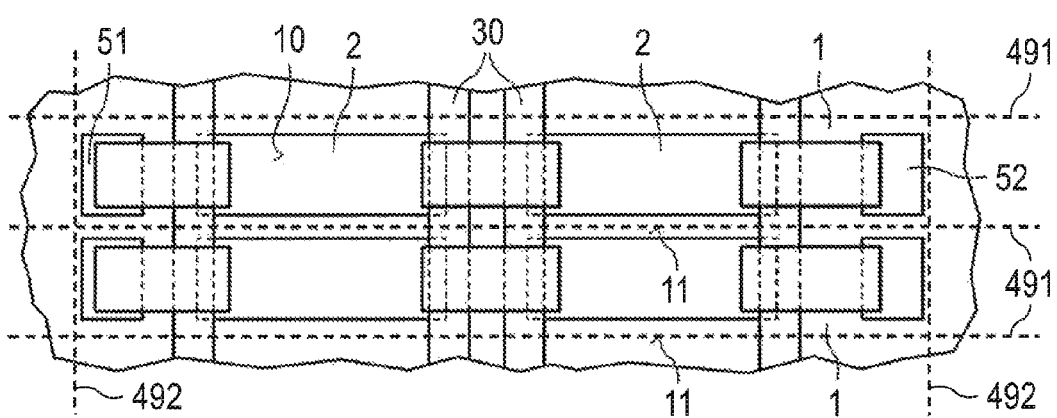
Figure 11A:
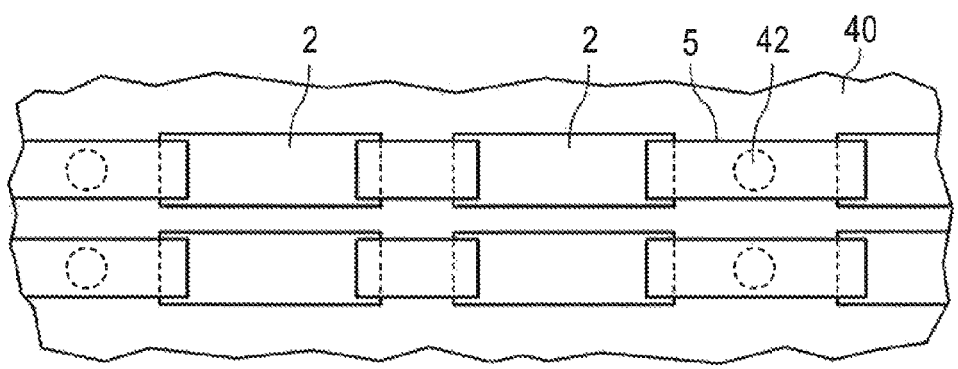
Figure 11B:
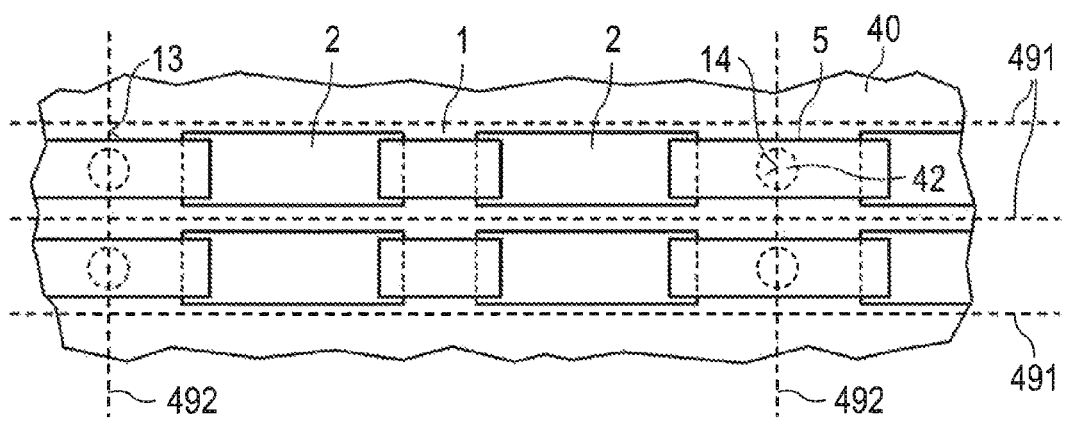

The figures show in:

FIGS. 1A and 1B a first exemplary embodiment for a semiconductor component in a plan view (FIG. 1B) and in an associated sectional view (FIG. 1A);

FIGS. 1C and 1D in each case an enlarged illustration in a sectional view with a semiconductor chip according to a first variant (FIG. 1C) and a second variant (FIG. 1D);

FIGS. 2, 3 and 4 in each case a second, third and fourth exemplary embodiment for a semiconductor component in a plan view;

FIGS. 5A and 5B a fifth exemplary embodiment for a semiconductor component in a schematic plan view (FIG. 5B) and in an associated sectional view along line BB' (FIG. 5A);

FIGS. 6A and 6B a sixth exemplary embodiment for a semiconductor component in a schematic plan view (FIG. 6B) and in an associated sectional view along line CC' (FIG. 6A);

FIGS. 7A and 7B a seventh exemplary embodiment for a semiconductor component in a schematic plan view (FIG. 7B) and in an associated sectional view (FIG. 7A);

FIG. 7C an exemplary embodiment for the contacting of the semiconductor component according to FIGS. 7A and 7B;

FIGS. 8A and 8B an eighth exemplary embodiment for a semiconductor component in a schematic plan view (FIG. 8B) and in an associated sectional view along line DD' (FIG. 8A);

FIG. 9A an exemplary embodiment for a device having a lighting device in a schematic plan view;

FIG. 9B an alternative arrangement for semiconductor components in a lighting device according to FIG. 9A;

FIGS. 10A to 10E a first exemplary embodiment for a method for producing semiconductor components by intermediate steps each illustrated in a schematic plan view; and FIGS. 11A and 11B a second exemplary embodiment for a method for producing semiconductor components by two intermediate steps schematically illustrated in a sectional view.

Like, similar or equivalent elements are indicated with like reference numerals throughout the Figures.

The Figures are each schematic illustrations and thus not necessarily true to scale. Comparatively small elements and particularly layer thicknesses may rather be illustrated in an exaggerated size for the sake of clarity.

A first exemplary embodiment for a semiconductor component 1 is shown in a plan view in FIG. 1B and in a sectional view along line AA' in FIG. 1A. The term "plan view" relates to a plan view of a radiation output side 10 of the semiconductor component 1, if not explicitly stated otherwise.

The semiconductor component 1 comprises a plurality of semiconductor chips 2 which are each provided for the generation of electromagnetic radiation during operation of the semiconductor component. The semiconductor components are arranged next to one another along a longitudinal direction, particularly in the type of rows.

The radiation output side 10 runs parallel to a main extension plane of the active region of the semiconductor chip (see FIGS. 1C and 1D).

Furthermore, the semiconductor component 1 comprises a molded body 4 which is formed to the semiconductor chips 2 and which mechanically connects the semiconductor chips to one another in a stable manner. In the vertical direction, i.e. perpendicular to the radiation output side 10, the molded body extends between a front side 45 facing the radiation output side 10 and a rear side 46 facing away from the front side. In the longitudinal direction, the semiconductor component extends between a first end face 13 and a second end face 14.

At least in the longitudinal direction, the molded body 4 at least sectionally adjoins the side surfaces of the semiconductor chips, respectively. In the exemplary embodiment shown, the molded body is adjacent to all four side surfaces of the semiconductor chips. Furthermore, the semiconductor chips 2 are covered by the material of the molded body at a rear side 292 facing away from the radiation output side 10.

The molded body 4 may contain or consist of a polymer material. For example, said polymer material may contain an epoxy, a silicone, PPA or polyester. The polymer material may be particularly filled with inorganic particles, for example for increasing reflectivity of the material of the molded body and/or for adjusting the thermal expansion coefficient. The particles may contain or consist of glass, $TiO_2$, $Al_2O_3$ or $ZrO$, for example.

Furthermore, the semiconductor component 1 comprises an insulation layer 30. In a plan view of the radiation output side, the insulation layer 30 sectionally covers the semiconductor chip 2 and the molded body 4. In particular, the insulation layer 30 extends beyond an edge delimiting the semiconductor chip 2 in the lateral direction. The insulation layer serves for a simplified electric contacting of the semiconductor chip 2, in particular by means of a planar contacting, i.e. a contacting that is free from wire bond connections.

Furthermore, the semiconductor component 1 may comprise a contact structure 50. In the exemplary embodiment shown, the contact structure exclusively runs on the front side 45 of the molded body 4. A rear-sided processing of the molded body for contacting purposes is thus not required.

The contact structure comprises a first contact surface 51 and a second contact surface 52. The first contact surface and the second contact surface are provided for the electric contacting of the semiconductor component 1. In the exemplary embodiment shown, the first contact surface 51 is arranged in a first end region 130 adjacent to the first end face 13 and the second contact surface 52 is arranged in a second end region 140 of the semiconductor component adjacent to the second end face 14. The semiconductor chips 2 are electrically conductively connected to the first contact surface 51 and the second contact surface 52 by means of the contact structure 50 and connected in series to one another. Neighboring semiconductor chips 2 are each electrically conductively connected to one another via contact tracks 55 of the contact structure. The contact structure 50 forms a planar contacting of the semiconductor chips.

At the edges of the semiconductor chip 2, via which the contact structure 50 is guided, the insulation layer 30 is arranged between the edge of the semiconductor chip and the contact structure 50 viewed in the vertical direction.

The semiconductor component 1 comprises side surfaces 12 connecting the front side 45 to the rear side 46. One of the side surfaces is designed as a mounting side surface 11. While being fastened to a connection carrier, for example a printed circuit board or a housing part, the mounting side surface is designed as a support surface so that radiation emitted perpendicularly through the radiation output side 10 runs parallel to the main surface of the connection carrier.

In the exemplary embodiment shown, the first contact surface 51 and the second contact surface 52 are accessible from the radiation output side 10 for an external electric contacting of the semiconductor component 1.

A front side of the semiconductor chip opposite the rear side 292 is free from material of the molded body 4. Each of the semiconductor chips 2 has two contacts electrically conductively connected to the contact structure 50. Two variants for suitable semiconductor chips will be described in greater detail with reference to a detailed view depicted in an enlarged illustration in FIGS. 1C and 1D.

In the exemplary embodiment illustrated in FIG. 1C, the semiconductor chip 2 comprises a semiconductor layer sequence 200 which is arranged on a carrier 29. The semiconductor layer sequence comprises an active region 20 provided for the generation of radiation. The active region 20 is arranged between a first semiconductor layer 21 and a second semiconductor layer 22, wherein the first semiconductor layer 21 and the second semiconductor layer 22 are at least sectionally different from one another in terms of the charge type, so that the active region 20 is in a p-n-junction. For example, the first semiconductor layer is p-conductive and the second semiconductor layer is n-conductive or vice versa. The first semiconductor layer 21 is arranged between the active region 20 and the carrier 29.

The semiconductor chip illustrated in FIG. 1C is designed as a thin film semiconductor chip, in which a growth substrate for the particularly epitaxial deposition of the semiconductor layer sequence 200 is removed and the carrier 29 mechanically stabilizes the semiconductor layer sequence 200. The semiconductor layer sequence 200 is fastened to the carrier 29 by means of a connection layer 28, for example a solder layer or an adhesive layer.

The first semiconductor layer is electrically conductively connected to the first contact 23 via a first connection layer 25. The first connection layer runs between the first semiconductor layer 21 and the carrier 29 in sections. The first connection layer or at least a partial layer thereof is particularly designed as a mirror layer for the radiation generated in the active region 20. For example, the first connection layer contains silver, aluminum, palladium or rhodium or a metallic alloy including at least one of the aforementioned materials.

The semiconductor layer sequence 200 comprises a plurality of recesses 27 extending through the first semiconductor layer 21 and the active region 20 into the second semiconductor layer 22. In the recesses 27, the second semiconductor layer 22 is electrically conductively connected to the second contact 24 via a second connection layer 26. Viewed in the vertical direction, the first connection layer 25 runs between the second connection layer 26 and the semiconductor layer sequence 200 in sections. The first contact 23 and the second contact 24 are each designed on the front side of the carrier 29. This way, shadowing of the active region by metallic layers for electrical contacting can be prevented.

In contrast, in the exemplary embodiment of a semiconductor chip illustrated in FIG. 1D, the carrier is formed by the growth substrate 29. A connection layer between the semiconductor layer sequence 200 and carrier 29 is thus not required. Said semiconductor chip also comprises two front-sided contacts for the electrical contacting of the semiconductor chip 2.

In both variants, the semiconductor chips 2 may protrude from the molded body 4 in the vertical direction, as illustrated in FIG. 1C. This achieves that the radiation output side of the semiconductor chip is free from material of the molded body in a simplified manner. However, the semiconductor chips may also terminate flush with the molded body or, as shown in FIG. 1D be arranged with the radiation output side thereof—viewed in the vertical direction—arranged beneath the front side 45 of the molded body 4, as illustrated in FIG. 4.

In the production of the semiconductor component 1, the side surfaces 12 and particularly the mounting side surface 11 arise when singulizing the composite into semiconductor components. Thus, the side surfaces may at least sectionally comprise singulation traces such as sawing traces or traces of a laser cutting method.

Compared to a semiconductor component in which semiconductor components are placed in a prefabricated housing, the molded body 4 develops during production by forming a molding material to the semiconductor chips 2. As a result, small distances between neighboring semiconductor chips and thus smaller distances between the lighting regions on the radiation output side 10 may be readily and reliably realized. For example, a distance between neighboring semiconductor chips is between including 0.1 mm and including 5 mm, preferably between including 0.1 mm and including 1 mm.

The dimensions of the semiconductor component 1 may be particularly small in the vertical direction just as well. For example, the vertical extension is between including 0.1 mm and including 1.5 mm. When using such a semiconductor component for the backlight of a display device in a device, the distance of the display device to the edge of the device may be reduced this way. This will be further explained in conjunction with FIG. 9A.

The transverse extension of the semiconductor component 1 viewed perpendicular to the longitudinal direction in a plan view of the radiation output side 10 is preferably greater than the extension of the semiconductor chip 2 along said direction by at most 50%, particularly preferably by at most 30%. When mounting the semiconductor component to the mounting side surface 11, the transverse extent corresponds to the height of the semiconductor component. The height of the semiconductor component 1 is preferably between including 0.1 mm and including 1 mm, preferably between including 0.1 mm and including 0.5 mm.

The extension may be adapted to the application specific requirements in the longitudinal direction and be varied within wide ranges. The extension in the longitudinal direction may be multiple millimeters, for example at least 2 mm, or even 1 cm or more.

The second exemplary embodiment shown in FIG. 2 essentially corresponds to the first exemplary embodiment illustrated in conjunction with FIGS. 1A to 1D. In contrast, the first contact surface 51 and the second contact surface 52 are each arranged in the first end region 130 of the semiconductor component 1. In a series connection of the semiconductor chips 2, a return line 56 may be formed between the semiconductor chip 2 located closest to the second end face 14 and the second contact surface 52. In the exemplary embodiment shown, the return line runs laterally past the semiconductor chip 2 in a plan view of the semiconductor component. In a semiconductor component 1 of this type, in particular also in a series connection of the semiconductor chip, both contacts required for external electric contacting are available in an end region.

The third exemplary embodiment illustrated in FIG. 3 essentially corresponds to the second exemplary embodiment described in conjunction with FIG. 2. In contrast, the semiconductor component 1 comprises at least one electronic component. In the exemplary embodiment shown, the electronic component 61 is designed as a constant current source and electrically conductively connected to the contact structure 50. In particular, the electronic component is arranged in a current path between the first contact surface 51 and the second contact surface 52. In addition, a further electronic component 62 is provided. Said further electronic component is designed to be an ESD protective element, e.g. an ESD protective diode or as a resistor. The further electronic component 62 is connected in parallel with the semiconductor chips 2. The electronic component, e.g. the constant current source, may be designed as an integrated circuit in a housing or as a flat flip chip without housing.

The semiconductor component 1 may naturally comprise more than two electronic components or only one electronic component, e.g. only one constant current source or only one ESD protective element.

The exemplary embodiment illustrate din FIG. 4 essentially corresponds to the third exemplary embodiment illustrated in conjunction with FIG. 3. In contrast, the semiconductor component 1 comprises a plurality of segments. The detailed view illustrates a segment 1*a* and another segment 1*b*. A severing spot 15 is formed between segments 1*a*, 1*b*. Each of the segments comprises at least one semiconductor chip 2, preferably two or more semiconductor chips. Furthermore, segments 1*a*, 1*b* each comprise a first contact surface 51 and a second contact surface 52. Before being severed along the severing spot 15, the first contact surface 51 of segment 1*a* and the first contact surface 51 of segment 1*b* as well as the second contact surface 52 of segment 1*a* and the second contact surface 52 of segment 1*b* are electrically conductively connected to one another. The segments can be operated jointly and are connected to one another in parallel in the exemplary embodiment shown. Two independently mountable and operable segments are produced by severing along the severing spot 15.

The length of the semiconductor component to be used can be readily adjusted even by the customer by means of severing at the severing spot 15. Depending on the type of electric connection between the individual segments, it is also possible to adjust the operating voltage by a variation of the length, e.g. in an electric series connection of individual segments.

The fifth exemplary embodiment illustrated in FIGS. 5A and 5B essentially corresponds to the first exemplary embodiment described in conjunction with FIGS. 1A to 1D.

In contrast, the semiconductor component 1 comprises a plurality of volume contact bodies 53. The volume contact bodies preferably extend entirely through the molded body 4 in the vertical direction. The first contact surface 51 and the second contact surface 52 are each formed by a volume contact body. The volume contact bodies are electrically conductively connected to the semiconductor chips 2 via the contact structure 50. The molded body 4 is formed to the volume contact body 3 at least on one side surface of said volume contact body. The volume contact body 3 is exposed at least on a side surface of the semiconductor component 1, for example at the mounting side surface 11. In the exemplary embodiment shown, the volume contact body 53 is exposed on the mounting side surface 11 and on the side surface 12 opposite the mounting side surface 11, respectively. Furthermore, one of the volume contact bodies 53 forms the first end face 13 and one of the volume contact bodies 53 forms the second end face 14. Thus, electric contacting can particularly be effected via the mounting side surface 11, the radiation output side 10 or the first end face 13 and the second end face 14, respectively, without that the coating deposited for forming the contact structure needs to cover the side surfaces of the semiconductor chip during manufacture of the semiconductor component.

The sixth exemplary embodiment illustrated in FIGS. 6A and 6B essentially corresponds to the first exemplary embodiment described in conjunction with FIGS. 1A to 1D. In contrast, semiconductor component 1 has indentations 16 in a plan view of the radiation output side 10. The side surfaces 160 of the indentations 16 are provided with a coating 54 as a part of the contact structure 50. The electric contacting may thus not only be effected from the radiation output side 10 but also from the first end face 13 or the second end face 14, respectively. In a plan view of the semiconductor component 1, the indentation preferably has the basic shape of a circle segment. Such a shape can be produced in a particularly simple manner. However, any other shape may generally be considered for said indentation 16.

The seventh exemplary embodiment illustrated in FIGS. 7A and 7B essentially corresponds to the sixth exemplary embodiment described in conjunction with FIGS. 6A and 6B. In contrast, the semiconductor component 1 comprises indentations 16 even at least between two neighboring semiconductor chips 2. In turn, the side surfaces of said indentations 16 are provided with a coating 54. Said indentations 16 allow for electrically contacting the semiconductor component 1 not only in the end regions 130, 140 but even between the semiconductor chips 2, particularly from the mounting side surface 11.

Furthermore, mechanical and thermal connection of the semiconductor component 1 is improved by means of the coated indentations 16. In particular, heat dissipation close to the semiconductor chip 2 can be achieved by the metal of the coating.

Furthermore, the semiconductor component 1 optionally comprises a radiation conversion element 97. Said radiation conversion element completely or at least partially covers in each case one semiconductor chip 2 in a plan view of the radiation output side 10 so that primary radiation generated in the semiconductor chip 2 is completely or at least partially converted into secondary radiation having a peak wavelength different from that of the primary radiation. For example, mixed light that appears to be white to the human eye is radiated. Such a radiation conversion element may naturally also be applied to the other exemplary embodiments described herein.

FIG. 7C shows a possible contacting of the semiconductor component 1 illustrated in FIG. 7B. Here, the semiconductor component 1 is divided in a group 17*a* and another group 17*b*, wherein the first group comprises one semiconductor chip 2 and the second group comprises multiple semiconductor chips 2 by way of example. The electric contacting of group 17*a* is effected via the first contact surface 51 in the first end region 130 and via the coating 54 of the indentation 16. Contacting of the further group 17b is effected via coating 54 of the indentation 16 and via the second contact surface 52, which is arranged in the second end region 140. Compared to a joint series connection of all semiconductor chips 2, the voltage required for the groups 17a, 17b can be reduced this way. Of course, the semiconductor component 1 may be divided in more than two groups, wherein the individual groups may each have the same number of semiconductor chips or have a different number of semiconductor chips at least in parts.

The eighth exemplary embodiment illustrated in FIGS. 8A and 8B essentially corresponds to the second exemplary embodiment described in conjunction with FIG. 2. In particular, the first contact surface 51 and the second contact surface 52 is arranged in the first end region 130. Thus, viewed in the longitudinal direction, the semiconductor component can be electrically contacted from one side. A return line 56 is formed between the semiconductor chip 2 located closest to the second end face 14 and the second contact surface 52. Said return line sectionally runs at the rear side 46. Furthermore, the return line runs through cut-outs 57 extending through the molded body 4 in the vertical direction. A return line which is guided laterally past the semiconductor chips 2—viewed in a plan view of sad return line—can be omitted. The construction height of the semiconductor component can thus be reduced further even in a series connection and both contact surfaces in an end region.

In the exemplary embodiment shown, a current path between the second contact surface and the semiconductor chip 2 located closest to the second end face 14 runs twice through the molded body in the vertical direction. In contrast thereto, the second contact surface 52 in the first end region 130 may also be arranged at the rear side 46. Furthermore, as an alternative or in addition, even the first contact surface 51 may be arranged at the rear side and be electrically conductively connected to the semiconductor chip 2 provided for the generation of radiation and located closest to the first end face via a recess in the molded body 4. Thus, both contact surfaces may be arranged on the rear side 46 of the molded body.

FIG. 9A shows an exemplary embodiment for a lighting device 9 in a device 95, e.g. a mobile electronic device, such as a cell phone or a mobile computer. The lighting device 9 comprises a semiconductor component 1 that is designed as described in conjunction with FIGS. 1A to 1D by way of example. However, as an alternative, the other above-described exemplary embodiments are also suitable. Furthermore, the lighting device 9 comprises a light guide 91 for backlighting a display device such as a liquid crystal display, wherein during operation of the lighting device, the radiation emitted by the semiconductor chips 2 is coupled into a side surface 910 of the light guide. Electrical contacting of the first contact surface 51 and of the second contact surface 52 is effected via a connection element 96 of the device, e.g. a spring pin, soldered or bonded plugs or cables. The semiconductor component may also be fastened directly to the light guide 91. In this case, the semiconductor component is preferably adapted to the light guide in terms of the thermal expansion coefficient.

The lighting device 9 may, as illustrated in FIG. 9B, comprise even more than one semiconductor component 1, e.g. two semiconductor components arranged next to one another along the side surface 910. In a series connection of the semiconductor chips in a semiconductor element 1, the supply voltage required for the operation can be divided in half by dividing the required semiconductor chips into two semiconductor components.

In the illustrated exemplary embodiment, a radiation conversion element 97 is arranged on the side surface 910 of the light guide 91. In contrast, the semiconductor component 1 may comprise the radiation conversion element, as described in conjunction with FIG. 7A, for example.

One exemplary embodiment for a method for producing semiconductor components is schematically illustrated in FIGS. 10A to 10E in a plan view of the later radiation output side, wherein semiconductor components are produced by way of example that are designed as described in conjunction with FIGS. 5A and 5B.

As shown in FIG. 10A, a plurality of semiconductor chips 2 is provided, for example on an auxiliary carrier, such as a foil or a rigid carrier. Furthermore, pre-fabricated volume contact bodies 53 are provided.

Subsequently, the semiconductor bodies 2 and the volume contact bodies 53 are overmolded by molding material for the formation of a molded body composite 40 (FIG. 10B). A casting method is suitable to that end, for example. The front side of the semiconductor chip remains free from the molding material.

As illustrated in FIG. 10C, an insulation layer 30 is applied to the molded body composite 40 with the semiconductor chips 2. Subsequently, a coating 5 is formed over the edges of the semiconductor chips 2, on which the insulation layer 30 is applied, for electric connection of the semiconductor chips 2 amongst one another (FIG. 10D). For example, said coating 5 may be applied by means of vapor deposition of sputtering and be reinforced after that, if required, e.g. by means of galvanic deposition. In the exemplary embodiment shown, merely the front side of the molded body composite is provided with the coating.

For the formation of the individual semiconductor components 1, the molded body composite 40 is singulized along the first separation lines 491 and second separation lines 492 running perpendicular thereto. During singulation, the side surfaces of the semiconductor components 1 arise, in particular the mounting side surface 11. The construction height of the semiconductor components 1 is thus predetermined in the production of the semiconductor components by the center-to-center distance of the first separation lines 491 relative to one another and by the width of the track during singulation.

Singulation may be effected mechanically, for example by means of sawing, chemically, for example by means of wet-chemical or dry-chemical etching, or by means of coherent radiation.

During singulation along the first separation lines 491 and/or along the second separation lines 492, the volume contact bodies 53 are exposed so that the semiconductor components 1 can be externally electrically contacted even on the first end faces 13 and the second end faces 14 located opposite to one another and/or on the mounting side surface 11.

In contrast to the described exemplary embodiment, the volume contact body 53 may also be omitted. In this case, external electric contacting of the semiconductor component 1 is preferably effected via the radiation output side 10, as described in conjunction with FIGS. 1A and 1B, for example.

FIGS. 11A and 11B show a second exemplary embodiment for a method for producing semiconductor components by means of two intermediate steps. Said second exemplary embodiment essentially corresponds to the first exemplary embodiment described in conjunction with FIGS. 10A to 10E. In contrast thereto, volume contact bodies 53 are not provided. Instead, the molded body composite 40 is designed such said composite comprises recesses 42. Preferably, said recesses 42 extend entirely through the molded body composite 40 in the vertical direction. Said recesses may be mechanically or chemically formed in the molding material composite already when forming the molding material composite, e.g. by a corresponding casting mold, or subsequently, for example by means of coherent radiation, mechanically or chemically.

Subsequently, the coating 5, as illustrated in FIG. 11A, is formed such that the side surfaces of the recesses 42 are covered with the material of the coating. For the sake of clarity, insulation layer 30 is not shown in FIGS. 11A and 11B. However, such an insulation layer may be present and designed as described above.

Singulation is effected, as illustrated in FIG. 11B, in such a way that the singulation runs along the first separation line 491 and/or the second separation lines 492 through the recesses 42. In FIG. 11B, by way of example, the second separation lines 492 run through the recesses 42 so that the first end faces 13 and the second end faces 14 developed during singulation each have an indentation formed by the recess 42.

The method described allows producing semiconductor components in a simple and reliable manner, the semiconductor components being characterized by a particularly compact design, in particular a low construction height, and allowing efficient coupling of comparatively great radiation power even into thin light guides.

This patent application claims priority of German patent application 10 2014 106 791.6, the disclosure of which is incorporated herein by reference.

The invention is not limited by the exemplary embodiments. The invention rather comprises any new feature as well as any combination of features, particularly including any combination of features in the patent claims, even if said feature or said combination per se is not explicated indicated in the patent claims or exemplary embodiments.

The invention claimed is:

1. A semiconductor component comprising:
   a plurality of semiconductor chips each comprising a semiconductor layer sequence having an active region for the generation of radiation;
   a radiation output side which runs parallel to the active regions;
   a mounting side surface which is provided for fastening the semiconductor component and runs inclined or perpendicular to the radiation output side;
   a molded body which is formed in places to the semiconductor chips and which at least sectionally forms the mounting side surface; and
   a contact structure which is arranged on the molded body and which electrically conductively connects at least two semiconductor chips of the plurality of semiconductor chips,
   wherein the semiconductor component has a rectangular basic shape with at least one indentation in a plan view of the radiation output side, wherein the contact structure at least sectionally covers a side surface of the indentation.

2. A semiconductor component according to claim 1, wherein the contact structure comprises a first contact surface and a second contact surface for the external electric contacting of the semiconductor component and the contact surfaces are accessible on the radiation output side and/or on the mounting side surface.

3. A semiconductor component according to claim 1, wherein the semiconductor component comprises a plurality of indentations and at least one said indentations is arranged between two neighboring semiconductor chips.

4. A semiconductor component according to claim 3, wherein the semiconductor chips of the semiconductor component which are provided for the generation of radiation are divided in at least two groups, wherein the groups can be externally electrically contacted independently from one another by means of the contact structure arranged in the indentations.

5. A semiconductor component comprising:
   a plurality of semiconductor chips each comprising a semiconductor layer sequence having an active region for the generation of radiation;
   a radiation output side which runs parallel to the active regions;
   a mounting side surface which is provided for fastening the semiconductor component and runs inclined or perpendicular to the radiation output side;
   a molded body which is formed in places to the semiconductor chips and which at least sectionally forms the mounting side surface; and
   a contact structure which is arranged on the molded body and which electrically conductively connects at least two semiconductor chips of the plurality of semiconductor chips,
   wherein the semiconductor component comprises an insulation layer between the molded body and the contact structure, the insulation layer sectionally covering the molded body and sectionally covering at least one of the semiconductor chips provided for the generation of radiation in a plan view of the radiation output side.

6. A method for producing a semiconductor component comprising the steps:
   a) providing a plurality of semiconductor chips which each comprise a semiconductor layer sequence with an active region provided for the generation of radiation;
   b) sectionally overmolding the semiconductor chips with a molding material for the formation of a molded body composite;
   c) forming a structured coating on the molding material composite for the electric contacting of the semiconductor chips; and
   d) singulizing the molded body composite into a plurality of semiconductor components which each comprise a plurality of semiconductor chips, wherein in each case at least two of the semiconductor chips of a semiconductor component are electrically conductively connected to one another by means of a contact structure formed by the structured coating and a side surface of the singulized molded bodies that develops during the singulation process forms a mounting side surface of the semiconductor component,
   wherein the molded body composite comprises a recess at least between two neighboring semiconductor chips prior to step c), which recess is provided with the coating.

7. A method according to claim 6, wherein prior to step b) electrically conductive volume contact bodies are provided, to which the molded body composite is formed in step b) and which are electrically conductively connected to at least one of the semiconductor chips via the structured coating in step c).

8. A semiconductor component, comprising:
a plurality of semiconductor chips each comprising a semiconductor layer sequence having an active region for the generation of radiation;
a radiation output side which runs parallel to the active regions;
a mounting side surface which is provided for fastening the semiconductor component and runs inclined or perpendicular to the radiation output side;
a molded body which is formed in places to the semiconductor chips and which at least sectionally forms the mounting side surface; and
a contact structure which is arranged on the molded body and which electrically conductively connects at least two semiconductor chips of the plurality of semiconductor chips;
wherein the contact structure comprises a first contact surface and a second contact surface for the external electric contacting of the semiconductor component and the contact surfaces are accessible on the mounting side surface.

9. A semiconductor component according to claim 8, wherein all semiconductor chips of the semiconductor component that are provided for the generation of radiation are arranged next to one another along a longitudinal direction running parallel to the radiation output side.

10. A semiconductor component according to claim 8, wherein the molded body at least sectionally covers in each case a rear side of the semiconductor chips facing away from the radiation output side.

11. A semiconductor component according to claim 8, wherein the semiconductor chips each comprise a first contact and a second contact which face the radiation output side and which are electrically conductively connected to the contact structure.

12. A semiconductor component according to claim 8, wherein the semiconductor component comprises at least one electronic component which is electrically conductively connected to the contact structure and which can be externally electrically contacted via the first contact surface and the second contact surface.

13. A semiconductor component according to claim 8, wherein the semiconductor component extends in between a first end face and a second end face in a plan view of the radiation output side, wherein the first contact surface is arranged in a first end region adjacent to the first end face and the second contact surface is arranged in a second end region of the semiconductor component adjacent to the second end face.

14. A semiconductor component according to claim 8, wherein the semiconductor component extends between a first end face and a second end face in a plan view of the radiation output side, wherein the first contact surface and the second contact surface are arranged in a first end region of the semiconductor component adjacent to the first end face.

15. A semiconductor component according to claim 8, wherein the semiconductor component comprises at least one electrically conductive volume contact body to which the molded body is formed and which is electrically conductively connected to the semiconductor chips.

16. A semiconductor component according to claim 8, wherein the semiconductor component comprises a plurality of segments with severing spots arranged therebetween, so that the segments are electrically conductively connected to one another before being severed at the severing spots and can be mounted and externally electrically contacted independently from one another after being severed.

17. A lighting device comprising at least one semiconductor component according to claim 8 and a light guide, wherein radiation passing through the radiation output side of the semiconductor component during operation couples into a side surface of the light guide.

18. A lighting device according to claim 17, in which at least two semiconductor components are arranged next to one another along the side surface of the light guide.

* * * * *